(12) United States Patent
Johnson et al.

(10) Patent No.: US 6,254,673 B1
(45) Date of Patent: Jul. 3, 2001

(54) AUXILLARY VACUUM APPARATUS AND METHOD FOR CRYSTAL GROWTH

(75) Inventors: Aaron W. Johnson; Aaron L. LaBrie, both of Vancouver; Randall Spradlin, Battle Ground, all of WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/457,416

(22) Filed: Dec. 7, 1999

(51) Int. Cl.[7] ....................................... C30B 15/00

(52) U.S. Cl. ................................................. 117/13

(58) Field of Search ................... 422/245.1, 250, 422/251, 252; 117/13, 14

(56) References Cited

U.S. PATENT DOCUMENTS 5,746,824 * 5/1998 Nemetz ................................. 117/13

* cited by examiner

Primary Examiner—Felisa Hiteshew
(74) Attorney, Agent, or Firm—Douglas G. Anderson; Timothy H. Courson

(57) ABSTRACT

A crystal pulling apparatus is disclosed which employs the Czochralski method. The crystal pulling apparatus is operated while a containing a crucible of molten material, while maintaining the growing chamber under a controlled pressure of less than atmospheric. In the event of a vacuum pump unexpectedly ceasing operation, power to the heater is terminated, thus allowing the molten material to solidify. In such an event, a second vacuum pump can readily be attached to the growing chamber thus restoring pressure control, and allowing power to the heater to be restored.

9 Claims, 2 Drawing Sheets

AUXILLARY VACUUM APPARATUS AND METHOD FOR CRYSTAL GROWTH

FIELD OF THE INVENTION

The present invention relates to an apparatus and method for producing a single crystal by the Czochralski technique comprising an auxiliary vacuum port, and an auxiliary vacuum pump dedicated to the machine in the event of failure of the primary vacuum pump.

BACKGROUND OF THE INVENTION

In a conventional crystal growing apparatus employing the Czochralski (CZ) technique, charge material, such as silicon, gallium-arsenide, and the like, that is to be grown into a single crystal is loaded into a crucible. A circumferential heater surrounds the crucible, and supplies heat to melt the charge material to a molten state. A seed crystal with the desired crystalline structure is then lowered into contact with the melt, and allowed to thermally stabilize. The seed is rotated one direction, and the crucible is rotated the opposite direction. The seed is then raised at a controlled rate, thus enabling growth of a crystal. Typically, crystal growth is accomplished at a pressure lower than atmospheric, with an inert purge gas supplied to flush the system of impurities.

A main controller is connected to respective control circuits for drive mechanisms, limit switches, sensors, pressure control and the like, so as to completely control the crystal pulling apparatus. For safety reasons, the supply of power to the heater is interlocked with sensors to other key items such as the vacuum pump, inert purge gas, and a cooling water system. As such, if an anomaly occurs in the vacuum system, inert purge gas system, or the like, the power supplied to the heater is shut off for safety reasons.

During a main vacuum pump failure situation, in a relatively short time the molten charge material will begin to freeze into a solid form. Such solidification of the molten charge material can cause significant damage and potential danger. It is common for the charge material to be wasted, as well as the crucible and other parts supporting the crucible due to thermal expansion. The associated costs with a failure from inoperable machine time, lost charge material, broken or damaged crucible and related parts, and time needed to clean and repair the crystal growing apparatus are significant. Moreover, an abrupt solidification of a large amount of the charge material may cause a leak of the melt, which could in turn lead to grower damage, and potentially a steam explosion or other significant safety problem.

To maintain reduced pressure, a vacuum pump is run continuously during the crystal pulling process. This main vacuum pump is subjected to substantial quantities of silicon oxide dust, a byproduct of molten silicon. In the past, oil-sealed vacuum pumps were used. However, oil-sealed pumps require a substantial amount of power, and the oil is a contaminant to the vacuum chamber.

It is now common to use a dry vacuum pump as the main vacuum pump in a crystal growing apparatus. Dry vacuum pumps use less electrical power, which lowers the cost of ownership, and they do not have oil to contaminate the process chamber. In contrast to the oil seals used in an oil-sealed pump, a dry pump relies on extremely close tolerances between its rotors and stators to provide the necessary seals within the pump. However, the extremely small gaps between the rotors and stator of a dry vacuum pump can be filled by the silicon oxide dust, resulting in increased load on the pump motor. Left unchecked, this increased load could result in overload of the motor, tripping a breaker and causing a shutdown of the crystal growing process. Thus, there has been a demand for measures to secure greater safety, and to reduce the costs associated with such an incident.

SUMMARY OF THE INVENTION

The present invention has been accomplished in view of the above-mentioned problems, and it is an object of the present invention to provide an environment for maintaining a safe, stable process state within the crystal growing apparatus upon the loss of a main vacuum pump.

The present invention provides a method of connecting the crystal growing apparatus vacuum piping normally dedicated to the main vacuum pump to the auxiliary vacuum pump instead. After the auxiliary pump has been connected, the controller for the crystal pulling apparatus is able to re-establish gas flow, pressure control, and control of the heater. This prevents the freezing of the molten charge material, damage to the crucible or other equipment, and product loss. Even though the heating state is briefly interrupted during the switch over from the primary vacuum source to the auxiliary vacuum source, no problem will arise because the thermal capacity of the molten charge material is sufficiently large.

DETAILED DESCRIPTION OF THE INVENTION

An embodiment of the present invention will now be described with reference to the drawings.

Figure 1:
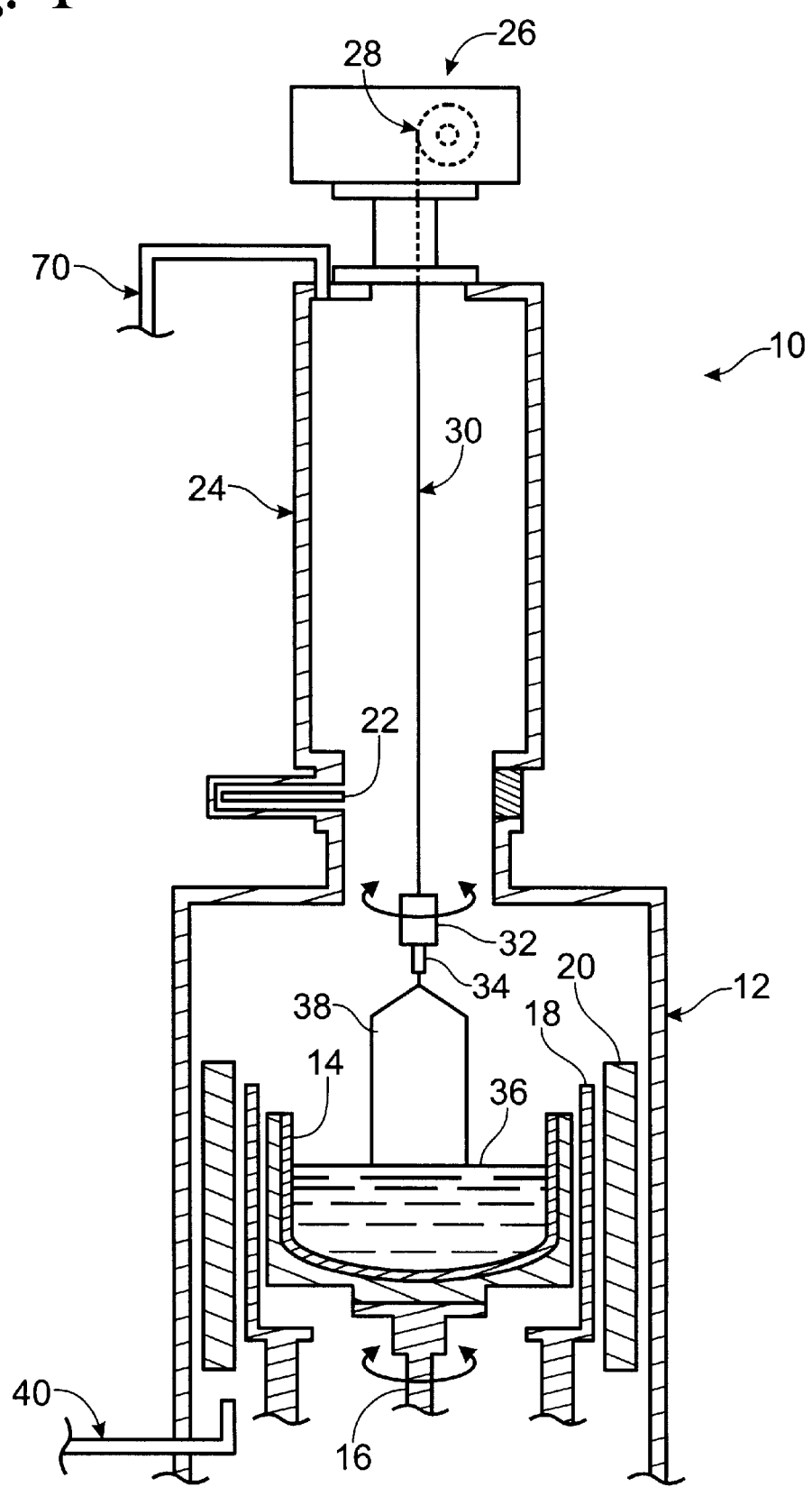
FIG. 1 is a sectional view of a crystal pulling apparatus.

As shown in FIG. 1., a crystal pulling apparatus 10 includes a bottom chamber 12. The bottom chamber 12 houses a quartz crucible 14, which is supported by a vertically moveable and rotatable susceptor and shaft assembly 16. A cylindrical heater 18 made of, for example, graphite is disposed around the susceptor 16, and is in turn surrounded by an insulating cylinder 20. The bottom chamber 12 also has a conduit 40 for evacuating air during start up, and process gas during crystal pulling operations utilizing the main vacuum pump (not shown).

A top chamber 24 is disposed above the bottom chamber 12 while an isolation valve 22 is disposed therebetween. The top chamber 24 provides a space for accommodating a pulled crystal. The isolation valve 22 functions to allow a vacuum tight separation between the top chamber 24 and the bottom chamber 12 thus enabling a pulled crystal to be removed from the top chamber 24 without losing vacuum or temperature in the bottom chamber 12. The top chamber 24 has a conduit 70 that goes to the auxiliary vacuum pump (not shown) that allows the top chamber to be evacuated of air and purge gases, so it may be rejoined with bottom chamber 12.

A winding mechanism 26 is disposed above the top chamber 24, and includes a winding drum 28 within the winding mechanism 26. The winding mechanism 26 is rotatable around a vertical axis with respect to the top chamber 24. A wire 30 is wound onto the winding drum 28, and extends downward. A seed chuck 32 for holding a crystal seed 34 is attached to the lower end of the wire 30.

When a single crystal is to be grown in the crystal pulling apparatus 10, the isolation valve 22 is in an open position so as to allow the seed 34 to be lowered into the bottom chamber 12. Both the bottom chamber 12 and the top chamber 24 are evacuated, and purged with an inert gas. Subsequently, a charge material, such as silicon, is placed in the crucible 14, and heated by the heater 18, thereby making a material melt 36.

The seed crystal 34 is lowered by the winding drum 28 until the end of the seed crystal 34 is lowered into the melt 36. After allowing the seed crystal 34 to reach temperature equilibrium with the melt 36, the winding drum 28 slowly begins to wind up the wire 30, thus enabling a crystal 38 to be pulled. During the pulling operation, the winding mechanism 26 and thus the seed are rotating in the opposite direction of the susceptor assembly 16.

A main controller (not shown) controls and monitors, among other things, the vacuum in the bottom chamber 12. When vacuum failure occurs in the bottom chamber 12, the power to the heater 18 is shut off.

Figure 2:
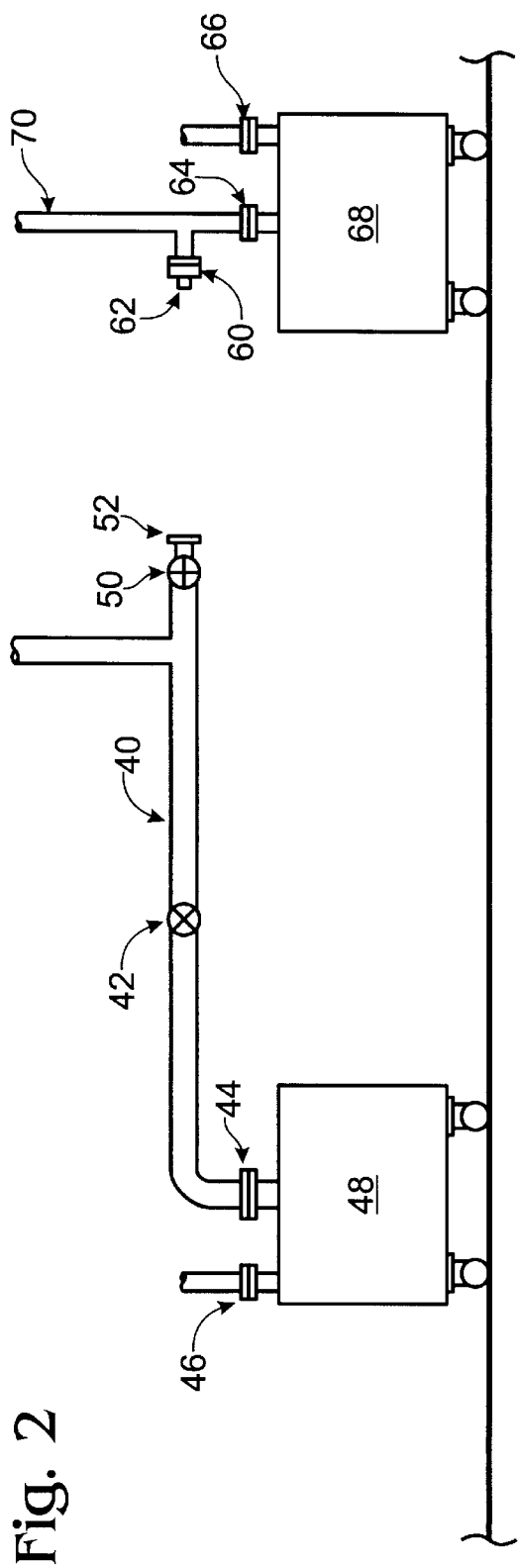
FIG. 2 is a schematic illustration of an embodiment of the present invention wherein the crystal pulling apparatus is operating under primary vacuum.
Figure 3:
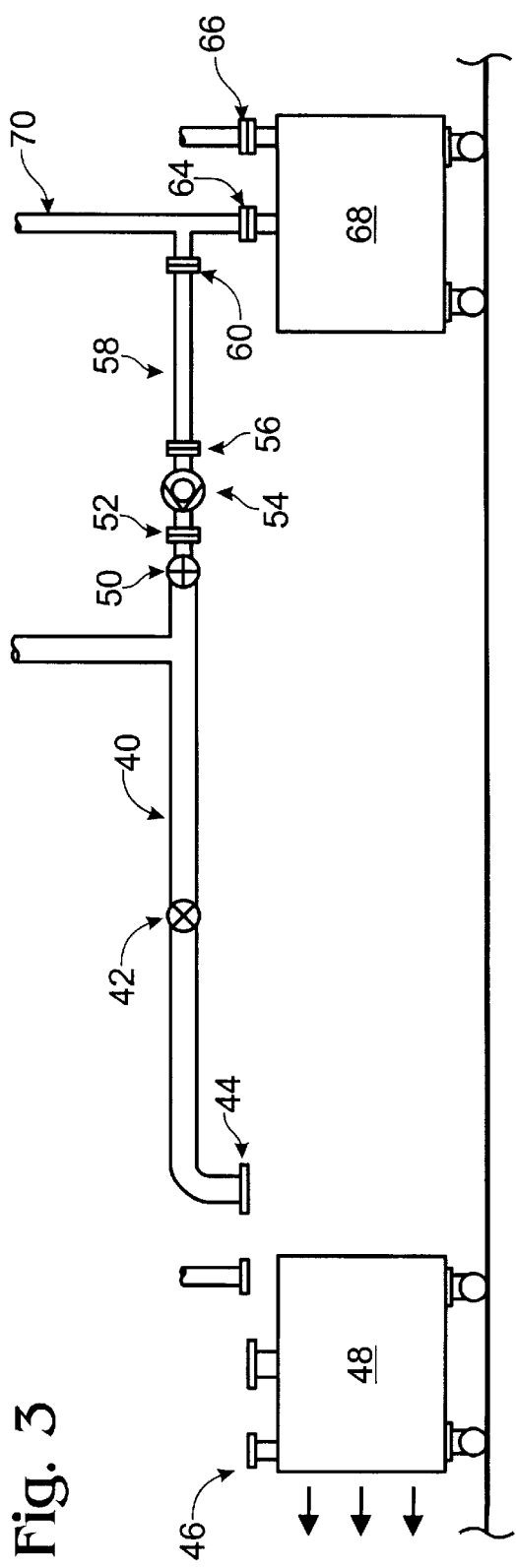
FIG. 3 is a schematic illustration of an embodiment of the present invention wherein the crystal pulling apparatus is operating under auxiliary vacuum.

Now turning to FIG. 2, exhaust gases flow from the bottom chamber through conduit 40 through a valve 42 and into the main vacuum pump 48. In a preferred embodiment of the present invention, in the event of vacuum failure, power is shut off to the heater, and valve 42 closes to prevent backflow of exhaust gas back into the bottom chamber. In such a failure, a conduit 58 containing a very low cracking pressure check valve 54, can be readily attached to conduit 40 through flange 52. The opposite end of conduit 58 is then attached to conduit 70 through flange 60, after making sure vacuum pump 68 is off, and opening cap 62. When the conduit 58 is attached to both conduit 40 and conduit 70, the operator can then open valve, thereby allowing the bottom chamber 12 to be evacuated by the auxiliary vacuum pump 68, as illustrated in FIG. 3. Purge gas flow can be re-initiated and the power to heater 18 can now be turned on, thus allowing the heater to maintain the melt 36 in a molten condition, thereby preventing freezing of the melt and damage to, for example, the crucible 14 and susceptor assembly 16, through thermal expansion of the melt 36.

After pressure control has been regained in the bottom chamber 12, the failed main vacuum pump 48 can be disconnected from conduit 40 through flange 44, and from the exhaust system (not shown) through flange 46. The main vacuum pump 48 can now be replaced or fixed, and reinstalled. After main vacuum pump 48 has been reinstalled, power to the heater 18 is again stopped, valve 50 is closed and valve 42 is reopened. The power to the heater 18 is again supplied, and the main vacuum pump 48 now provides pressure control for the bottom chamber 12. Vacuum pump 68 can now be shut off, and conduit 58 can now be removed, thus returning the crystal pulling apparatus to normal operating conditions. After allowing growing conditions to stabilize, crystal pulling may resume.

An alternate form of the present invention would provide permanent fixed conduit and valves to auxiliary vacuum pump 68, with the main controller programmed such that in detection of a failed main vacuum pump 48, all requisite valves are actuated as described above in the manual method automatically, with a warning alarm activated to inform the operator.

Yet another alternative form of the present invention would allow for the 58 to be attached to flange 44 after the removal of primary vacuum pump 48 on one end, and attached to flange 60 of the auxiliary pump 68, thus eliminating the need for valve 50, flange 52, and valve 54.

Other embodiments of the present invention will be apparent to those skilled in the art from a consideration of this specification or practice of the invention disclosed herein. It is intended that the specification be considered in all aspects only as illustrative and not restrictive. The scope of the invention is, therefore, indicated by the appended claims rather than by the foregoing description. All changes which come within the meaning and range of the equivalence of the claims are to be embraced within their scope.

What is claimed is:

1. A method of maintaining a charge material in a molten state after a heater has been shut off due to a failed vacuum pump, the method comprising:
    a) closing a valve in a conduit between a bottom chamber of a crystal grower and a first vacuum pump;
    b) placing a conduit between said closed valve and a second vacuum pump;
    c) opening said valve; and
    d) restarting the heater.

2. The method of claim 1, wherein at least one of said first and second vacuum pumps is a dry pump.

3. The method of claim 1, wherein at least one of said first and second vacuum pumps is an oil-sealed vacuum pump.

4. A method of maintaining a charge material in a molten state after a heater has been shut off due to a failed vacuum pump, the method comprising:
    a) closing a first, normally-open, valve in a conduit between a bottom chamber of a crystal grower and a first vacuum pump;
    b) attaching a removable conduit to a second, normally-closed valve, attached to said conduit attached to the bottom chamber of a crystal grower at one and, and to a second vacuum pump on the other end;
    c) opening said second valve; and
    d) restarting the heater.

5. The method of claim 4, wherein said second vacuum pump is used to evacuate a top chamber of a crystal pulling apparatus.

6. An apparatus for growing crystals under a vacuum during growing conditions, comprising:
    a) A bottom chamber of a crystal grower having a primary pressure valve in the normally-open state, and secondary pressure valve in the normally-closed position,
    b) A top chamber of a crystal grower having a primary pressure valve in the normally-closed position,
    c) A pressure seal that separates the top and bottom halves of the crystal grower,
    d) A first vacuum pump connected to said bottom chamber of crystal grower via said primary pressure valve,
    e) A second vacuum pump connected to said top chamber of crystal growing apparatus via said primary pressure valve of said top chamber of crystal growing apparatus, and an auxiliary pressure valve in the normally-closed position, and
    f) piping that connects the secondary pressure valve of said bottom chamber of crystal grower to the auxiliary pressure valve of said second vacuum pump.

7. The apparatus of claim 6, wherein at least one of said first and second vacuum pumps is a dry pump.

8. The apparatus of claim 6, wherein at least on of said first and second vacuum pumps is an oil-sealed vacuum pump.

9. An auxiliary vacuum pump system for controlling pressure in a bottom chamber of a crystal growing apparatus in the event of a primary vacuum pump failure, the auxiliary vacuum pump system comprising:

a) means for isolating a bottom chamber of a crystal growing apparatus from a first vacuum pump;

b) means for attaching a second vacuum pump to said bottom chamber; and c) controlling the pressure of said bottom chamber by said second vacuum pump.

* * * * *